United States Patent [19]

Han et al.

[11] Patent Number: 5,408,191

[45] Date of Patent: Apr. 18, 1995

[54] INPUT BUFFER HAVING A COMPENSATION CIRCUIT FOR STABILIZING THE OUTPUT THEREOF

[75] Inventors: Sung-jin Han, Seoul; Chung-keun Kwak, Kyungki, both of Rep. of Korea

[73] Assignee: Samsung Electronics Co., Ltd., Kyungki, Rep. of Korea

[21] Appl. No.: 143,095

[22] Filed: Oct. 29, 1993

[30] Foreign Application Priority Data

Oct. 29, 1992 [KR] Rep. of Korea ..................... 92-19989

[51] Int. Cl.[6] ................. H03K 17/14; H03K 19/0948; H03K 19/003
[52] U.S. Cl. ....................................... 326/33; 326/34; 326/121; 327/543; 327/546
[58] Field of Search ..................... 307/451, 443, 296.8, 307/475, 491; 326/31–34, 83, 121; 327/543, 546

[56] References Cited

U.S. PATENT DOCUMENTS

| | | | |
|---|---|---|---|
| 4,763,021 | 8/1988 | Stickel | 307/296.8 |
| 5,051,630 | 9/1991 | Kogan et al. | 307/451 |
| 5,073,726 | 12/1991 | Kato et al. | 307/451 |
| 5,136,182 | 8/1992 | Fawal | 307/296.8 |
| 5,278,460 | 1/1994 | Casper | 307/296.8 |

*Primary Examiner*—Edward P. Westin
*Assistant Examiner*—Jon Santamauro
*Attorney, Agent, or Firm*—Robert A. Westerlund; Stephen R. Whitt; Charles R. Donohoe

[57] ABSTRACT

An input buffer particularly suitable for a semiconductor device includes a CMOS inverter for buffering an input signal which varies between first and second logic levels and producing an output signal at an output node thereof which is the logical inverse of the input signal, and a compensation circuit for compensating the output signal for fluctuations thereof which are due to fluctuations of a supply voltage. The CMOS inverter preferably includes a pull-up MOS transistor having a gate, a first electrode coupled to a supply voltage, and a second electrode, and a pull-down MOS transistor having a gate, a first electrode coupled to a reference voltage, and a second electrode. The compensation circuit preferably includes a compensation MOS transistor having a gate, a first electrode coupled to the second electrode of the pull-up MOS transistor, and a second electrode coupled to the second electrode of the pull-down MOS transistor, with the output node being located intermediate the second electrode of the compensation MOS transistor and the second electrode of the pull-down MOS transistor. The compensation circuit further includes a compensation control circuit coupled to the supply voltage for controllably varying the electrical resistance of the channel of the compensation MOS transistor in such a manner as to minimize fluctuations of the voltage level of the output signal due to fluctuations of the supply voltage.

9 Claims, 2 Drawing Sheets

INPUT BUFFER HAVING A COMPENSATION CIRCUIT FOR STABILIZING THE OUTPUT THEREOF

BACKGROUND OF THE INVENTION

The present invention relates generally to input buffers of the type commonly employed in semiconductor devices, and, more particularly, to an input buffer having a compensation circuit for stabilizing the output thereof.

With reference to FIG. 1, there can be seen an input buffer of conventional construction. The conventional input buffer depicted in FIG. 1 includes a PMOS transistor 1 whose source electrode is connected to the supply voltage Vcc and whose gate electrode is connected to an enable signal EN; a PMOS transistor 2 whose gate electrode is connected to the source electrode of PMOS transistor 1 and whose gate electrode is connected to an input signal IN; an NMOS transistor 3 whose drain electrode is connected to the drain electrode of PMOS transistor 2, whose gate electrode is connected to input signal IN, and whose source electrode is grounded; and, an NMOS transistor 4 whose drain electrode is connected to the drain electrode of NMOS transistor 3, whose source electrode is grounded, and whose gate electrode is connected to the enable signal EN.

In operation, when the enable signal EN goes "high", NMOS transistor 4 is turned on, thereby driving output signal (OUT) "low", regardless of the logic level of the input signal (IN). When the enable signal EN goes "low", NMOS transistor 4 is turned off and PMOS transistor 1 is turned on, thereby pulling up the voltage level of the source electrode of PMOS transistor 2 to near Vcc. At this time, if the input signal (IN) is "high", the output signal (OUT) is "low", and conversely, if the input signal (IN) is "low", the output signal (OUT) is "high". When the enable signal EN and the input signal IN are low, fluctuations of the supply voltage Vcc cause corresponding fluctuations of the output signal OUT, which constitutes a significant drawback.

Based on the above, it can be appreciated that there presently exists a need in the art for an input buffer which does not suffer from the above-described drawback of the presently available input buffers commonly utilized in semiconductor devices. The present invention fulfills this need.

SUMMARY OF THE INVENTION

The present invention encompasses an input buffer particularly suitable for a semiconductor device, and which includes a CMOS inverter for buffering an input signal which varies between first and second logic levels and producing an output signal at an output node thereof which is the logical inverse of the input signal, and a compensation circuit for compensating the output signal for fluctuations thereof which are due to fluctuations of a supply voltage. The CMOS inverter preferably includes a pull-up MOS transistor having a gate, a first electrode coupled to a supply voltage, and a second electrode, and a pull-down MOS transistor having a gate, a first electrode coupled to a reference voltage, and a second electrode. The compensation circuit preferably includes a compensation MOS transistor having a gate, a first electrode coupled to the second electrode of the pull-up MOS transistor, and a second electrode coupled to the second electrode of the pull-down MOS transistor, with the output node being located intermediate the second electrode of the compensation MOS transistor and the second electrode of the pull-down MOS transistor. The compensation circuit further includes a compensation control circuit coupled to the supply voltage for controllably varying the electrical resistance of the channel of the compensation MOS transistor in such a manner as to minimize fluctuations of the voltage level of the output signal due to fluctuations of the supply voltage.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 1:
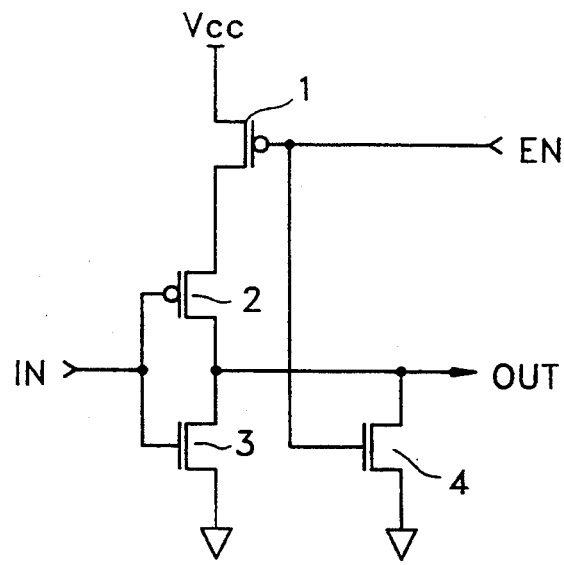
FIG. 1 is a schematic diagram of an input buffer of conventional construction.
Figure 2:
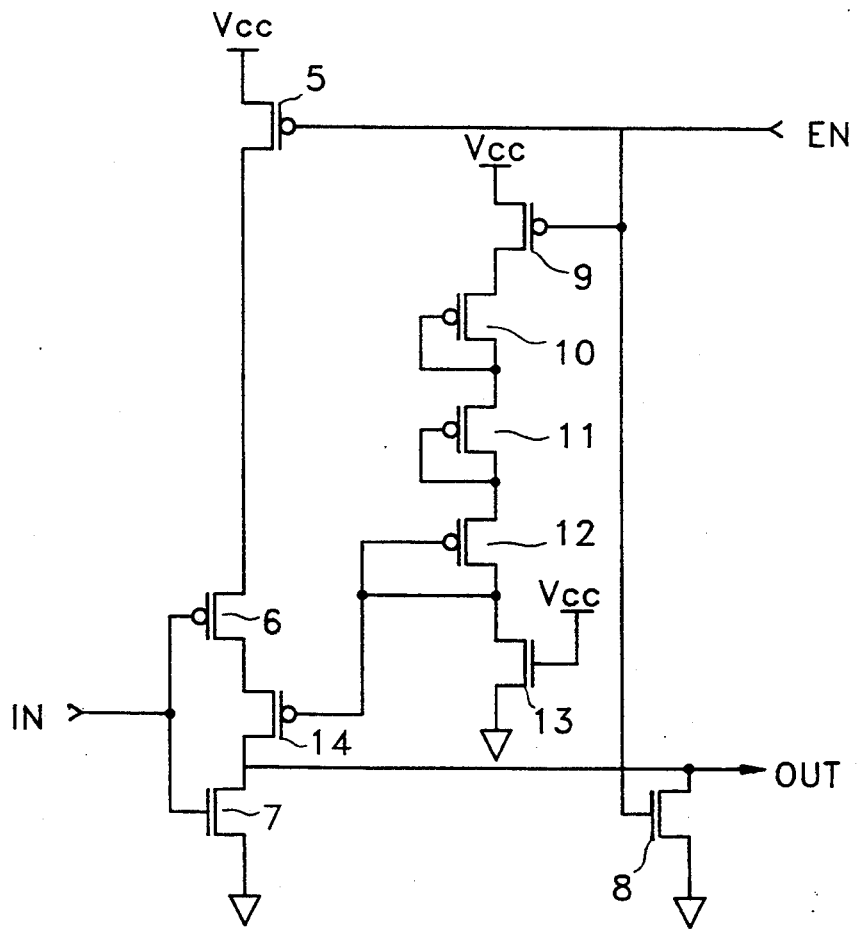
FIG. 2 is a schematic diagram of an input buffer constructed in accordance with a preferred embodiment of the present invention.

With reference now to FIG. 2, the input buffer constructed in accordance with a preferred embodiment of the present invention includes a PMOS transistor 5 whose source electrode is connected to a supply voltage Vcc and whose gate electrode is connected to an enable signal EN; a PMOS transistor 6 whose source electrode is connected to the drain electrode of the PMOS transistor 5 and whose gate electrode is connected to an input signal IN; an NMOS transistor 7 whose gate electrode is connected to the input signal IN and whose source electrode is connected to ground; an NMOS transistor 8 whose gate electrode is connected to the enable signal EN, whose source electrode is connected to ground, and whose drain electrode is connected to the drain electrode of the NMOS transistor 7; a PMOS transistor 9 whose source electrode is connected to the supply voltage Vcc and whose gate electrode is connected to the enable signal EN; a PMOS transistor 10 whose source electrode is connected to the drain electrode of the PMOS transistor 9 and whose gate and drain electrodes are each commonly connected; a PMOS transistor 11 whose source electrode is connected to the drain electrode of the PMOS transistor 10 and whose gate and drain electrodes are each commonly connected; a PMOS transistor 12 whose source electrode is connected to the drain electrode of the PMOS transistor 11 and whose gate and drain electrodes are each commonly connected; an NMOS transistor 13 whose gate electrode is connected to the supply voltage Vcc, whose drain electrode is connected to the drain electrode of the PMOS transistor 12 and whose source electrode is connected to ground; and, a PMOS transistor 14 whose source electrode is connected to the drain electrode of the PMOS transistor 6, whose gate electrode is connected to the drain electrode of the PMOS transistor 12 and whose drain electrode is connected to the drain electrode of the NMOS transistor 7.

As will become evident from the following description of the operation of the above-described preferred embodiment of the input buffer of the present invention, the PMOS transistors 9, 10, 11, 12 and 14, and the NMOS transistor 13 collectively comprise a compensation circuit which compensates the level of the output voltage OUT in response to fluctuations of the supply voltage Vcc, to thereby minimize fluctuations in the output voltage OUT due to fluctuations in the supply voltage Vcc, especially when the output voltage OUT is above a predetermined threshold level, e.g., 1 V.

In operation, because the supply voltage Vcc is applied to the gate of the NMOS transistor 13, the NMOS transistor 13 is always turned on, and the voltage at the drain electrode of the NMOS transistor 13 is always "low". Therefore, since the gates of the PMOS transistors 12 and 14 are commonly coupled to the drain electrode of the NMOS transistor 13, then the PMOS transistors 12 and 14 are also always turned on. Further, since the PMOS transistor 12 is always turned on, then the PMOS transistors 10 and 11 are also always turned on. When the enable signal EN goes low, the PMOS transistors 5 and 9 are turned on, and the NMOS transistor 8 is turned off, thereby enabling the input buffer. In the enabled state, the series-connected pull-up transistor 6 and pull-down transistor 7 function to invert the input signal IN applied to the gates thereof, with the result being that the output signal OUT is the inverse of the input signal IN. In other words, the series-connected PMOS transistor 6 and NMOS transistor 7 function as a CMOS inverter. In this enabled state, increases in the supply voltage Vcc will increase the voltage applied to the gate of the PMOS transistor 14 connected between the pull-up transistor 6 and the pull-down transistor 7, thereby increasing the channel resistance (or, alternatively, reducing the channel conductance) of the PMOS transistor 14. This increase in the channel resistance of the PMOS transistor 14 causes a decrease in the level of the output voltage OUT, when the PMOS pull-up transistor 6 is turned on, which occurs when the input signal IN is low. However, since the level of the output voltage OUT is increased when the supply voltage Vcc increases, the reduction in the level of the output voltage OUT due to the action of the PMOS transistor 14 offsets this increase, thereby compensating the output voltage OUT for fluctuations in the supply voltage Vcc. Thus, the transconductance of the PMOS transistor 14 is controllable in such a manner as to stabilize the voltage level of the output signal OUT when it is at a high logic level.

Figure 3:
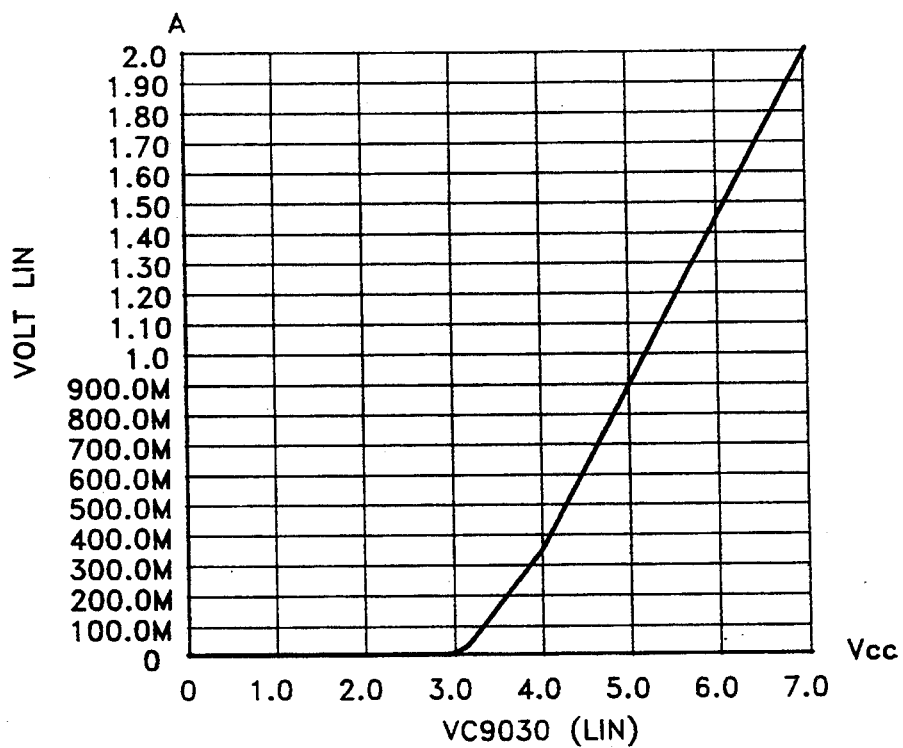
FIG. 3 is a graph illustrating the voltage level of the gate electrode of PMOS transistor 14 of the input buffer depicted in FIG. 2 versus the level of the supply voltage Vcc; and, FIG. 4 is a graph illustrating the output voltage characteristics of both the conventional input buffer depicted in FIG. 1 and the input buffer of the present invention depicted in FIG. 2.
Figure 4:
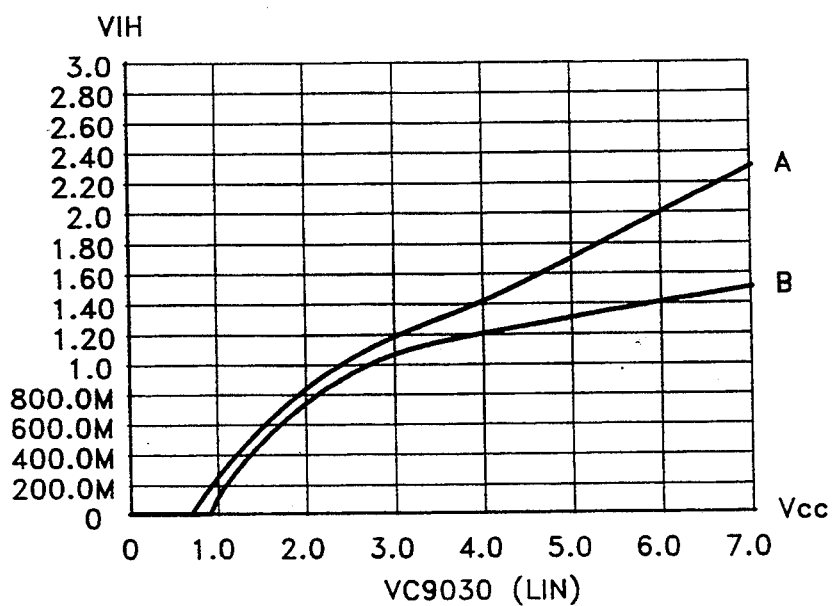

With reference now to FIG. 3, it can be seen that the voltage applied to the gate of the PMOS transistor 14 increases in a substantially linear fashion from 0 V to 2 V as the supply voltage Vcc increases from 3 V to 7 V. With additional reference now to FIG. 4, it can be seen from the characteristic curve B that the output voltage OUT increases only slightly with increases in the supply voltage Vcc for values of the supply voltage Vcc above 3 V (or, alternatively, for values of the output voltage OUT above 1 V), relative to the output voltage characteristics of the conventional input buffer illustrated by the characteristic curve A. Essentially, the characteristic curve B of the output voltage OUT flattens out beyond a predetermined level of the supply voltage Vcc, so that fluctuations of the output voltage OUT due to fluctuations of the supply voltage Vcc are greatly minimized, thereby stabilizing the output voltage OUT when it is at its high logic level.

Although a preferred embodiment of the present invention has been described in detail hereinabove, it should be clearly understood that many variations and/or modifications of the basic inventive concepts herein taught which may appear to those skilled in the pertinent art will still fall within the spirit and scope of the present invention as defined in the appended claims.

What is claimed is:

1. An input buffer, comprising:
   a pull-up MOS transistor having a gate, a first electrode coupled to a supply voltage, and a second electrode;
   a pull-down MOS transistor having a gate, a first electrode coupled to a reference voltage, and a second electrode;
   a compensation MOS transistor having a gate, a first electrode coupled to said second electrode of said pull-up MOS transistor, and a second electrode coupled to said second electrode of said pull-down MOS transistor;
   wherein said gate of said pull-up MOS transistor and said gate of said pull-down MOS transistor are commonly coupled to an input signal which varies between first and second logic levels;
   an output node between said second electrode of said compensation MOS transistor and said second electrode of said pull-down MOS transistor, wherein a buffer output signal produced at said output node is the logical inverse of said input signal;
   a compensation control circuit coupled to said supply voltage for controllably varying the electrical resistance of the channel of said compensation MOS transistor in such a manner as to minimize fluctuations of the voltage level of said output signal due to fluctuations of said supply voltage, wherein said compensation control circuit comprises:
   a first MOS transistor having a first electrode coupled to said supply voltage, a second electrode, and a gate coupled to an enable signal;
   a second MOS transistor having a first electrode coupled to said second electrode of said first MOS transistor, a second electrode, and a gate commonly coupled to said gate of said compensation MOS transistor and said second electrode of said second MOS transistor, wherein said first and second MOS transistors are of the same conductivity type;
   a reference MOS transistor having a first electrode coupled to said second electrode of said second MOS transistor, a second electrode coupled to said reference voltage, and a gate coupled to said supply voltage, wherein said reference MOS transistor is of a conductivity type opposite that of said first and second MOS transistors; and,
   wherein a node intermediate said first electrode of said reference MOS transistor and said second electrode of said second MOS transistor is coupled to said gate of said compensation MOS transistor.

2. The input buffer as set forth in claim 1, further comprising an enable MOS transistor connected in series between said first electrode of said pull-up MOS transistor and said supply voltage, said enable MOS transistor having a gate coupled to an enable signal which varies between first and second logic levels.

3. The input buffer as set forth in claim 2, further comprising an output node pull-down MOS transistor having a first electrode coupled to said output node, a second electrode coupled to said reference voltage, and a gate coupled to said enable signal.

4. The input buffer as set forth in claim 3, wherein said pull-up MOS transistor and said pull-down MOS transistor are of opposite conductivity types.

5. The input buffer as set forth in claim 4, wherein said pull-up MOS transistor is a PMOS transistor and said pull-down MOS transistor is an NMOS transistor.

6. The input buffer as set forth in claim 5, wherein said compensation MOS transistor is a PMOS transistor.

7. The input buffer as set forth in claim 6, wherein said enable MOS transistor is a PMOS transistor.

8. The input buffer as set forth in claim 7, wherein said output node pull-down MOS transistor is an NMOS transistor.

9. The input buffer as set forth in claim 1, wherein said compensation control circuit further comprises third and fourth PMOS transistors connected in series between said second electrode of said first PMOS transistor and said first electrode of said second PMOS transistor, and wherein further, the gate and drain electrode of each of said third and fourth PMOS transistors are commonly connected to each other.

* * * * *